United States Patent
Halpern et al.

[11] Patent Number: 6,165,554
[45] Date of Patent: Dec. 26, 2000

[54] METHOD FOR HYDROGEN ATOM ASSISTED JET VAPOR DEPOSITION FOR PARYLENE N AND OTHER POLYMERIC THIN FILMS

[75] Inventors: Bret Halpern, Bethany; Raymond F. Graves, Milford, both of Conn.

[73] Assignee: Jet Process Corporation, New Haven, Conn.

[21] Appl. No.: 09/189,927

[22] Filed: Nov. 12, 1998

Related U.S. Application Data

[60] Provisional application No. 60/065,142, Nov. 12, 1997.

[51] Int. Cl.⁷ .................................................. C23C 16/00
[52] U.S. Cl. ................................... 427/248.1; 427/255.5; 427/446; 427/488
[58] Field of Search ............................. 427/255.6, 488, 427/497, 507, 446, 248.1, 255.5

[56] References Cited

U.S. PATENT DOCUMENTS

| | | |
|---|---|---|
| 4,788,082 | 11/1988 | Schmitt . |
| 4,957,061 | 9/1990 | Ando et al. . |
| 5,104,634 | 4/1992 | Calcote . |
| 5,256,205 | 10/1993 | Schmitt, III et al. . |
| 5,310,583 | 5/1994 | Eckstein et al. ...................... 427/575 |
| 5,356,672 | 10/1994 | Schmitt, III et al. . |
| 5,356,673 | 10/1994 | Schmitt et al. . |
| 5,571,332 | 11/1996 | Halpren ............................ 118/723 HC |
| 5,650,197 | 7/1997 | Halpern ............................... 427/248.1 |
| 5,720,821 | 2/1998 | Halpern ................................... 118/719 |
| 5,759,634 | 6/1998 | Zang ....................................... 427/446 |
| 5,935,638 | 8/1999 | Chandra et al. ......................... 427/58 |

FOREIGN PATENT DOCUMENTS 0 286 306   3/1988   European Pat. Off. .

OTHER PUBLICATIONS

"High–Quality MNS Capacitors Prepared by Jet Vapor Deposition at Room Temperature" by Dechang Wang, Tso–Ping Ma, John W. Golz, Bret L. Halpern and Jermone J. Schmitt IEEE Electron Device, ERS, vol. 13, No. 9 Sep. 1992, pp 482–484.

*Primary Examiner*—Shrive Beck
*Assistant Examiner*—Bret Chen
*Attorney, Agent, or Firm*—McCormick, Paulding & Huber LLP

[57] ABSTRACT

A method is presented for the vapor deposition of a material film upon a substrate. The method comprises the use of a Jet Vapor Deposition process with a vaporized polymer gas flowing at supersonic velocity. The vaporized polymer gas consists of a carrier gas and a vaporized polymer, such as Parylene. The vaporized polymer gas impinges upon the substrate through a port and forms the material film.

14 Claims, 6 Drawing Sheets

METHOD FOR HYDROGEN ATOM ASSISTED JET VAPOR DEPOSITION FOR PARYLENE N AND OTHER POLYMERIC THIN FILMS

CROSS REFERENCE TO RELATED APPLICATION

This application claims priority to the Provisional Application which was filed on Nov. 12, 1997, as application Ser. No. 60/065,142.

FIELD OF INVENTION

This invention relates, in general, to a system for the deposition of polymer thin films and more particularly, is directed to a new kind of deposition system incorporating a Jet Vapor Deposition (hereinafter, 'JVD') source apparatus utilizing hydrogen atom (H atom) assisted polymer deposition for the deposition of Parylene thin films. The source apparatus and deposition process can be modified for deposition of other polymers as well.

BACKGROUND OF THE INVENTION

Deposited thin films have major, diverse technological functions and enormous commercial value. There now exist diverse methods for vapor deposition of metals, semiconductors, insulators and organics, as well as complex multicomponents such as oxides and nitrides; these are described, for example, in R. Bunshah's text. In general, deposition methods fall into two classes. In Chemical Vapor Deposition (hereinafter, 'CVD'), precursor molecules react at a heated substrate, usually at relatively high pressures, to generate species that comprise the deposited film. In Physical Vapor Deposition (hereinafter, 'PVD'), the film species are generated some distance from the substrate, usually in a high vacuum; the gas phase mean free path is large, and film species travel by "line of sight" to deposit on the substrate.

Deposition techniques do not always fit this traditional description. The assignee of the present invention has developed a family of vapor deposition methods referred to as Jet Vapor Deposition (JVD), in which film species are made remotely, as in PVD, but the vacuum is "low", and the mean free path small. Film components travel "line of sight" because they are convected in a sonic, collimated, "jet in low vacuum". Exemplary processes, based on patented JVD sonic nozzle sources such as the hot filament wirefeed, and the "electron jet" or "e-jet", include deposition of metals such as Cu, Au, Ag, Sn, Pb, Ni, Ti, Ta, and many others, singly or as alloys, in simple or multilayer form. However, it is also possible in JVD to convect species to the substrate that then undergo film forming or film modifying reactions at the surface just as in CVD.

Polymer films are of interest for protective and electrical properties, and several methods exist for their deposition. A simple example is the "spin-on" of liquid precursors, as in the familiar first step of semiconductor photo-lithography. A more general and powerful approach is plasma polymerization. The effects of different plasma conditions are described in the book "Plasma Polymerization" by H. Yasuda, Academic Press, Inc. 1985, and the critical importance of free radicals is discussed in detail.

However, there are a few molecules which are exceptional in that the generation of film forming radicals can easily be accomplished by simple thermal means, without need of assistance from a plasma. The Parylenes are the outstanding example of this type, and their behavior is unusual. Heating of a simple precursor molecule creates radicals that then polymerize on a room temperature or cooled surface. The basic chemistry [M. J. Szwarc, Disc. Far. Soc. 2 46 (1957)] and commercial process [Gorham, U.S. Pat. No. 3,342,754, September 1967)] are now well known, although much still remains to be learned about the mechanisms of Parylene deposition. FIG. 1a shows the structure of the dimer Parylene precursor, di-para-xylylene, 1, and the subsequent steps needed to deposit poly-p-xylylene. The dimer 1 is vaporized at ~150° C. (not shown) and passed through a "cracking" section at ~680° C. where it is thermally split into two reactive monomers which can exist either in the di-radical form 2, with two unpaired electrons, or the quinonoid form 3. Both forms are highly reactive.

Deposition of these monomers occurs on surfaces held at room temperature or below; polymerization occurs in the film by a free radical mechanism which has been much studied but is still incompletely understood. The growing film is regarded as "quasi-liquid"; the monomer is first physically adsorbed on the surface, and then may diffuse into the growing film, where it can react with the ends of other radical chains. The deposition rate is determined and limited by the rate of adsorption and reaction of reactive monomer in the film. Cooling the substrate has a large effect on growth rate, by increasing the physical adsorption lifetime for depositing monomers thereon and hence the time available for reaction.

Parylene occurs in several modifications, denoted as Parylene N, C or F, as seen in FIG. 1b; the Cl and F substituents alter the properties of the film, and affect the ease of deposition. For example, Parylene C will deposit at room temperature, because the strong C–Cl dipoles promote the long physical adsorption lifetimes that favor polymerization. Parylene N, less polar, will not deposit on any surface above 30° C., and useful deposition rates are only gotten on surfaces cooled much below room temperature. Parylene N has a lower dielectric constant, however, than Parylene C. Low dielectric constant is a desirable property, making the Parylenes top candidates for "low K" applications in integrated circuits.

Although some variations have appeared in the literature, systems for deposition of the Parylenes are based on the Gorham process described above. They normally operate in a range of low pressures, 20–80 millitorr. The gas flow speeds are very small; indeed, carrier gases need not be used at all. The systems are many feet long, extremely large by comparison with JVD systems, in which a typical source can be mounted on a 4" flange, and held in one hand.

Because reactive Parylene monomers are easily generated by heating, as was illustrated in FIG. 1a, it might appear to be of no advantage to allow the gas phase monomers or the growing film to interact, during deposition, with energetic species emerging from a plasma. Indeed, employing such direct interaction is heretofore unknown and is a major aspect of the present invention.

SUMMARY OF INVENTION

It is an object of the present invention is to provide a JVD system applicable to the deposition of polymers, such as from the Parylene family.

It is another object of the present invention to provide a JVD system that allows Hydrogen atoms to interact with both the Parylene molecules in a carrier gas and with deposited Parylene films, to thereby influence crosslinking and physical properties and produce great improvements in film quality.

It is another object of the present invention to provide a JVD system which is compatible with a moving substrate, multiple jet JVD method for the large area deposition of multicomponent and multilayer film structures.

According to one preferred embodiment, a deposition chamber has at least one port for allowing access to a deposition chamber interior and a pump is utilized for producing a predetermined pressure within this deposition chamber interior. There is a translation means positioned with the deposition chamber interior for receiving a substrate and for moving this substrate relative to the deposition chamber interior.

A gas jet apparatus is utilized for directing a jet of a material, through at least one port, onto the substrate by providing controlled entry of the material into the deposition chamber interior. The gas jet apparatus includes a first nozzle, having a first end portion and an opposing second end portion, with a first interior cavity for issuing a vaporized polymer from a nozzle tip adjacent to the second end portion. A first gas inlet serves to provide a carrier gas to the first interior cavity at a pressure greater than a pressure within the deposition chamber interior, creating a supersonic jet of vaporized polymer gas consisting of the carrier gas and vaporized polymer, directed towards the substrate surface. A second nozzle, including an excitation means, has a second interior cavity for issuing a jet of atoms, generated by operation of the excitation means.

A second gas inlet serves to provide an elemental gas to the second interior cavity at a pressure which is also greater than a pressure within said deposition chamber interior, issuing thereby the jet of generated atoms directed towards the substrate surface.

The vaporized polymer gas and the generated atoms impinge upon the substrate surface and together form a material film.

The JVD system of the present invention operates in low vacuum and offers advantages for Parylene deposition, including improved adhesion to substrates, higher deposition rates, augmented degrees of crosslinking, and control of properties. Further, the JVD system of a preferred embodiment combines elements of a JVD Parylene jet source and a hydrogen atom JVD microwave discharge jet source to provide a number of advantages. These include good adhesion to substrates and enhanced crosslinking leading to better control of properties. High jet speed avoids gas phase formation of "snow" or very large clusters. A reduced index of refraction, implying a lower dielectric constant, has also been achieved and is important for integrated circuit applications.

In a preferred embodiment, the present invention extends to Parylenes the JVD advantages of multiple jet synthesis of complex structures such as metal-polymer or ceramic-polymer layered film structures. These structures are extremely difficult to produce in the standard Parylene process, but are straightforward in JVD. It would be difficult to produce high concentrations of Hydrogen atoms in a standard Parylene process because the flow speed and pressure are too low for $H_2$ microwave discharges to be efficiently operated. Therefore, while the standard Parylene process is not carried out in a high speed jet mode, or in the presence of plasma generated Hydrogen atoms, the present apparatus and process according to an embodiment of the present invention provides new advantages and improvements to the standard process by doing so.

These and other objectives of the present invention, and their preferred embodiments, shall become clear by consideration of the specification, claims and drawings taken as a whole.

DESCRIPTION OF PREFERRED EMBODIMENTS

Figure 1A:
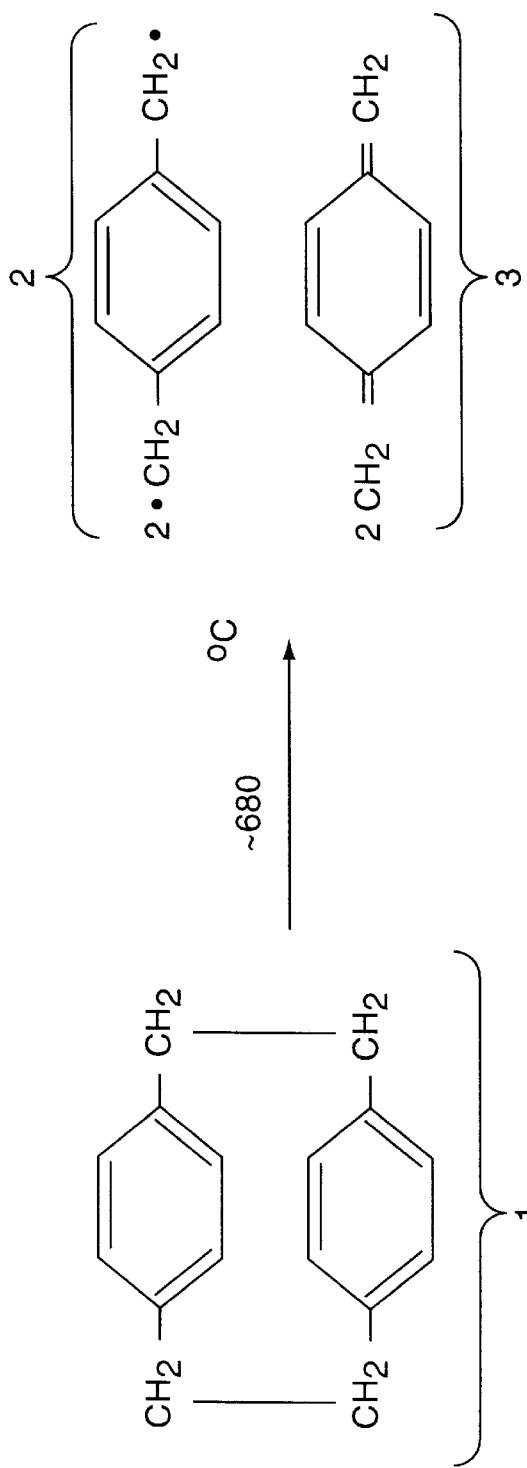
FIG. 1a shows the molecular structure of a Parylene dimer precursor and the reactive di-radical and quinonoid species derived from it.
Figure 1B:
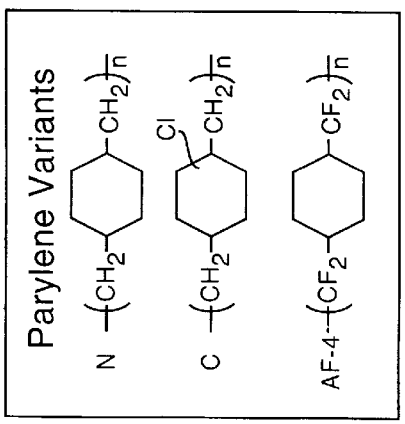
FIG. 1b shows the molecular structure of a Parylene dimer variants.
Figure 2:
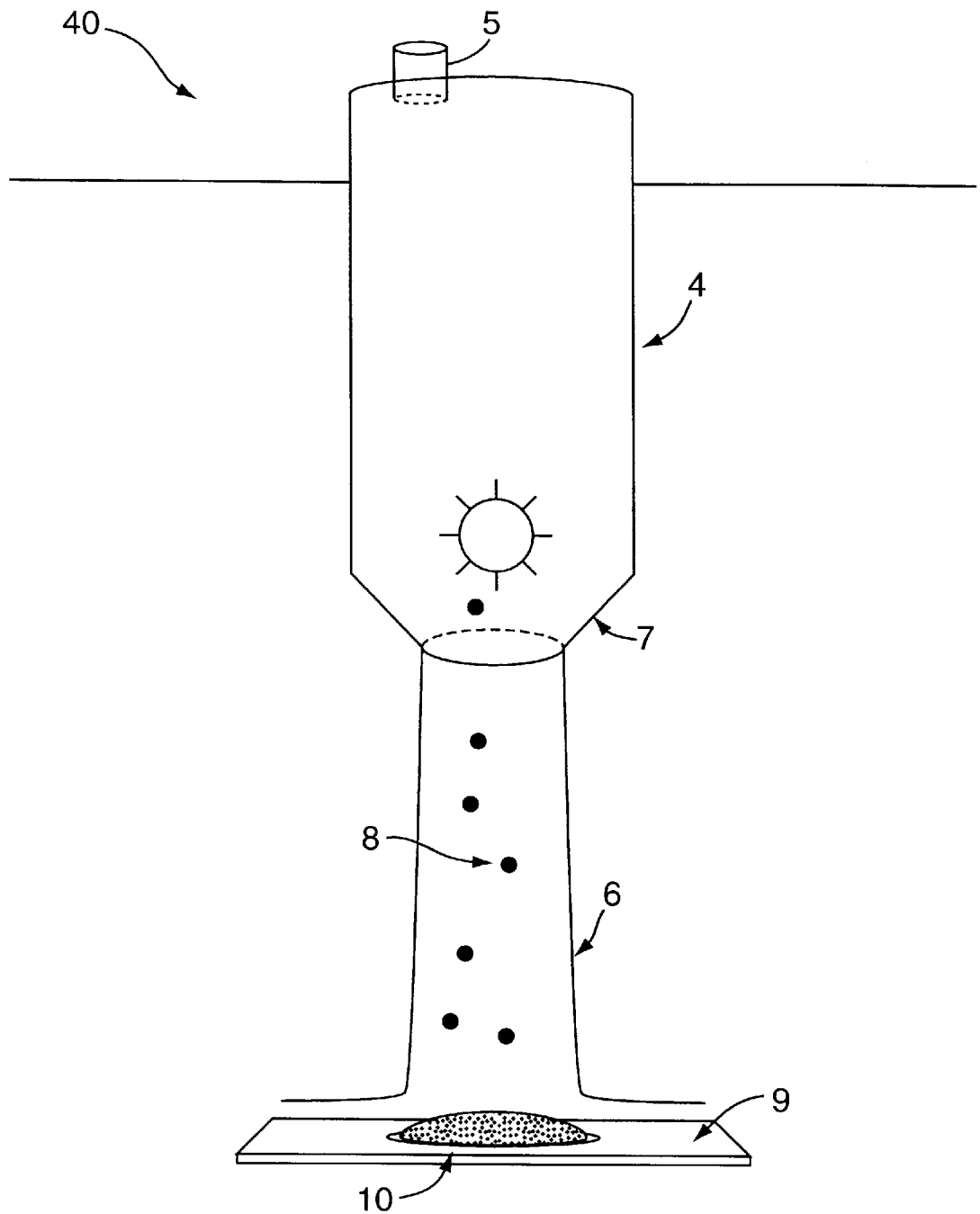
FIG. 2 is a simplified schematic illustration of a basic JVD jet apparatus source.

A basic JVD apparatus source 40 is illustrated in FIG. 2. A common feature of all JVD apparatus sources is a nozzle 4, supplied with an inert carrier gas, usually Helium (He) or Argon (Ar), via an inlet 5, which entrains atoms, molecules or radicals and deposits them on a substrate 9 downstream. The nozzle 4 has diameters typically on the order of ½", but can alternatively range from 2 to 20 mm. Pressures are usually in the range of 1 to 10 torr in the nozzle, and 0.1–1 torr downstream; many JVD advantages can be traced to this choice of pressure regime. The carrier gas is driven by a mechanical pump (not shown) under "critical flow" conditions, ($P_{nozzle}/P_{downstream} \geq 2$), so that a collimated jet 6 emerges at the speed of sound, approximately $10^5$ cm/sec for He. The pumping speeds of the mechanical pump/Roots blower stacks, not shown in FIG. 2, typically range from 4000 to 20,000 lit/min.

Metal vapor, for example, is generated in the nozzle throat 7 by thermal or plasma assisted vaporization, or by sputtering; $Si_3N_4$ is made by microwave discharge chemistry with a patented JVD microwave discharge source, disclosed and claimed in U.S. Pat. No. 5,356,672, having a parent U.S. Pat. No. 4,788,082, both incorporated herein by reference. The carrier gas jet convects film forming species 8 to the substrate 9 downstream. Variations of the JVD apparatus source 40 vaporize and deposit almost any element in the Periodic Table. Combinations of jets lead to versatile synthesis of alloys, multicomponent oxides and nitrides, nanolaminates, and doped films.

Figure 3A:
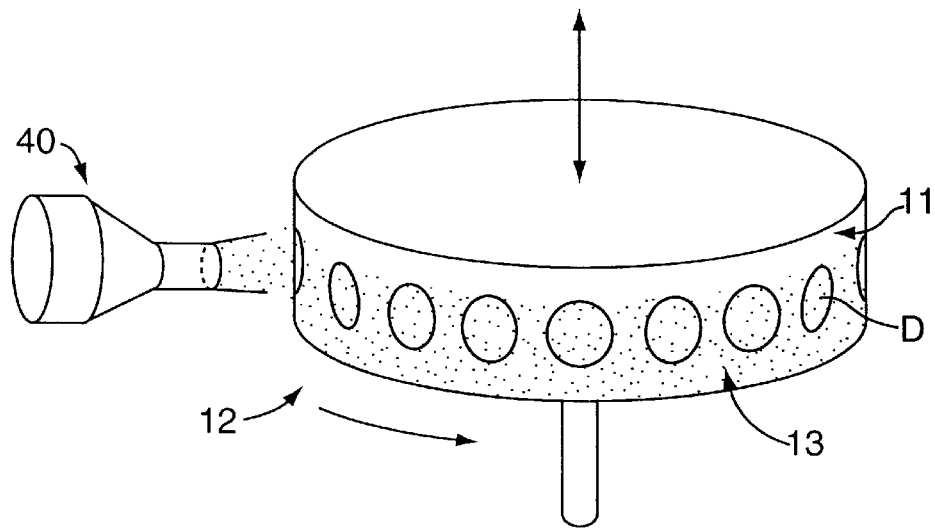
FIGS. 3a and 3b are simplified schematic illustrations of two JVD jet-substrate relative motion strategies; a movable substrate carousel in FIG. 3a, and a single movable wafer substrate in FIG. 3b.
Figure 3B:
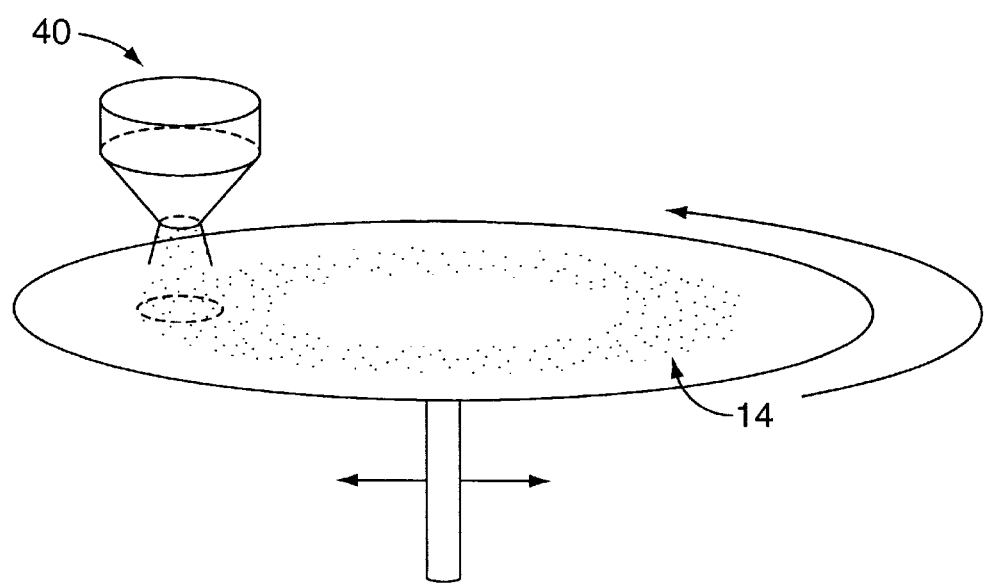

On a stationary substrate the deposit 10 forms in a localized zone, an area about one $cm^2$, with a near-Gaussian distribution about the jet axis. Larger area coverage and uniform thickness are achieved through a computerized, two-dimensional relative motion of jet and substrate. These strategies are seen in FIGS. 3a and 3b. FIG. 3a illustrates one approach in mounting a substrate 11 on a spinning and translating carousel 12. If the carousel 12 is not moving, the deposit D formed by the JVD apparatus source 40 is circular and thicker at the middle. If movement of the carousel is restricted to spinning only, the deposit forms an annulus (not shown). If it both spins and oscillates along its own axis, so that every substrate point is exposed for equal times, the entire substrate 11 is efficiently coated with a uniform film 13. In this way, even though the stationary deposit D is thicker at the center, large areas are coated uniformly. In a second approach shown in FIG. 3b, a single large Si wafer 14 is spun about its axis and "scanned" along a diameter through the jet JVD apparatus source 40 with a variable, computer controlled speed that gives equal jet exposure at all points on the wafer 14. It should be readily appreciated that it is possible to aim several jets at the carousel and deposit complex multicomponent or layered structures.

The JVD apparatus source 40, as is illustrated in FIGS. 2, 3a and 3b, is typically small scale, uses a high speed carrier gas flow and works in a "low vacuum" of 1–10 torr. The standard process i.e., the Gorham process, for the deposition of Parylene is large scale, low flow speed, and works at 10–100 millitorr. It is therefore heretofore unknown to achieve successful results in the deposition of Parylene utilizing the process previously discussed in conjunction with the JVD apparatus source 40. It is a major aspect of the present invention, however, to have Parylene deposited using a novel Jet Vapor apparatus. Most of JVD processes involve vaporization and deposition of metals. In these cases, it is only necessary to vaporize the metal in the nozzle. For Parylene, there is an additional step: cracking, i.e., activation. One must vaporize at low temperature and activate at high temperature, otherwise the Parylene molecule will not be able to polymerize. Metal atoms, on the other hand, automatically bond to each other when they land on the substrate; no "activation" is needed after vaporization. Therefore, the chemistry of Parylene film formation differs greatly from that of metal film deposition.

Figure 4:
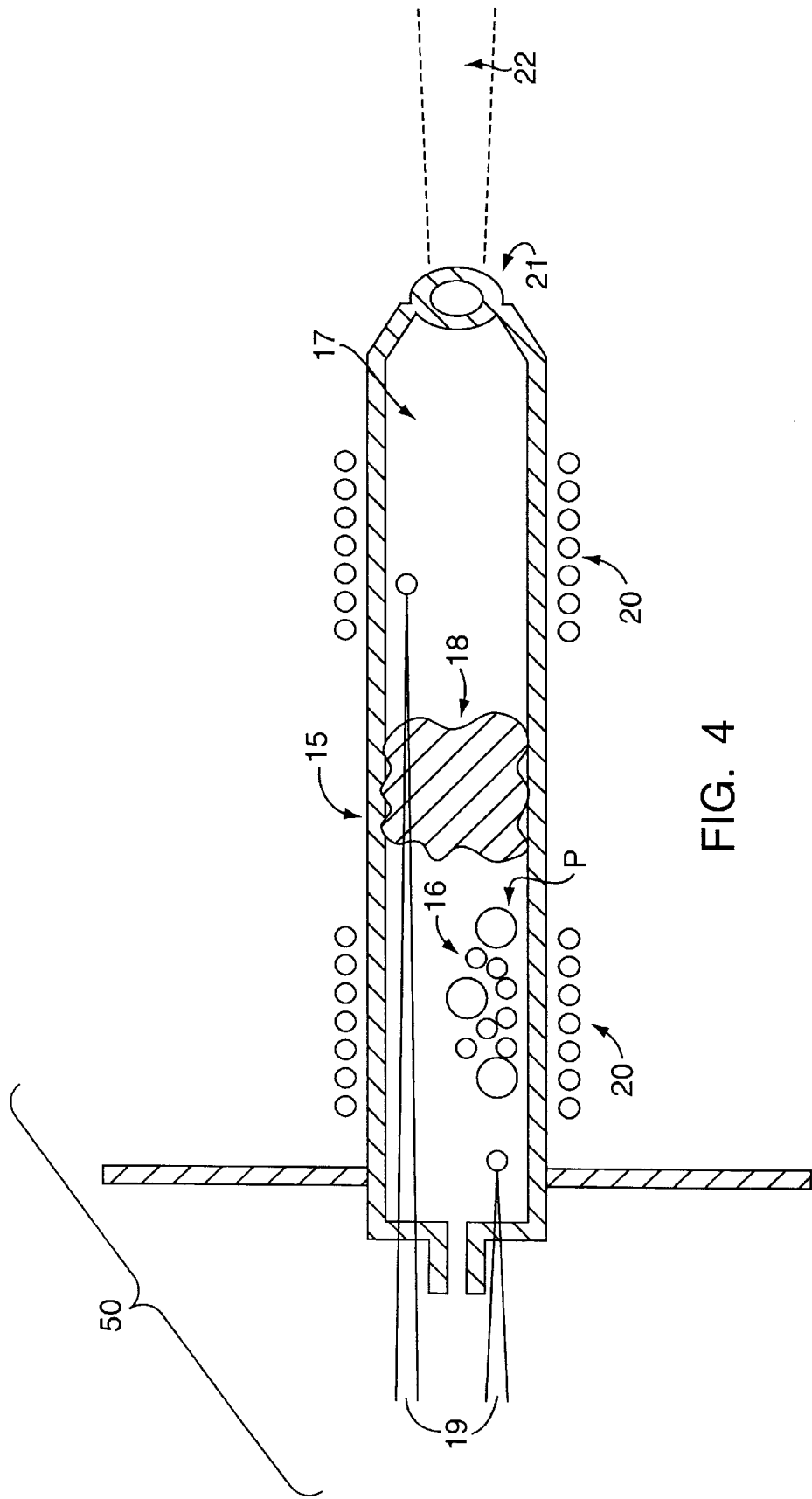
FIG. 4 is a simplified schematic illustration of a JVD vapor apparatus source of Parylene.

FIG. 4 shows a JVD apparatus source 50 adapted for Parylene C or N. In its simplest embodiment, the nozzle 15 is a straight tube of quartz or a tube of Pyrex joined to a tube of quartz by a graded seal; the diameter is ½ inch O.D; and the entire length is 3–4 inches. The nozzle 15 contains a low temperature vaporization section 16, which may be crafted from Pyrex, for vaporizing the Parylene dimer precursor, which is available in powder or granular form P. This is followed by a high temperature cracking section 17, which is preferably crafted from quartz, to generate the reactive monomer as described previously. The cracking section 17 is separated from the vaporization section by a quartz wool plug 18, tight enough to stop the Parylene powder from being dragged downstream by the fast gas flow, but loose enough to permit free flow of vaporized Parylene. The junctions of two thermocouples 19, typically 0.005" diameter chromel-alumel, are placed in both the vaporization and cracking sections, 16 and 17 respectively, for temperature measurement. Both sections are wound with electrically heatable coils 20 and maintained at the required temperatures, approximately 150° C. for vaporization and approximately 680° C. for cracking, by means of temperature controllers using the outputs of the thermocouples 19 in a feedback loop (not shown). The jet exit 21 of the cracking section is contracted to a small diameter, preferably approximately 1–5 millimeters (mm) and more preferably approximately 2 mm, by heating in a torch, so that the nozzle pressure can be kept higher than that downstream, and the flow speed in the nozzle 15 kept lower than downstream.

The vaporization section 16 is loaded with the Parylene granules P and the nozzle 15 is mounted in a deposition chamber supplied with, for example, He or Ar carrier gas at approximately 1 torr, and pumped with a mechanical pump of moderate speed (e.g., 4000 liters/minute). The nozzle 15 is aimed, for example, at a spinning/translating carousel loaded with substrates, such as glass slides or Silicon wafers. The vaporization and cracking heating coils 20 are then activated and the parylene dimer is carried from vaporization section 16 to cracking section 17. The result is a collimated inert gas jet 22 that emerges from the cracking section carrying reactive paraxylylene monomers. The jet 22 is traveling at speeds of more than several thousand cm/second, orders of magnitude faster than any flows attained in the standard Parylene deposition process. The reactive monomers reach the substrate, physisorb, and react/polymerize in the growing film. It has therefore been discovered that the JVD apparatus source 50 works well for the deposition of polymers such as Parylene C and enables the deposit of thin films upon a substrate surface at room temperature.

In contrast, however, the JVD apparatus source 50 will not work in the same way for Parylene N. As is well known to those skilled in the art, Parylene N films will typically only deposit if the substrate is cooled much below room temperature. To see if this was true for a JVD system, a carousel was constructed that could be cooled to approximately −100° C. while rotating and oscillating along its axis. It was confirmed that the Parylene N deposition rate increased strongly as the temperature dropped from −10° C. to −80° C. and, at room temperature, the deposition rate was virtually zero.

In order to overcome the virtual lack of deposition at room temperature, coupled with the extreme inconvenience and expense of having to cool a moving carousel, it was discovered that utilizing Hydrogen atoms, to enhance the production of Parylene radicals in the film or arriving at the film, greatly promoted the deposition of Parylene N on the substrate surface. Such a deposition process is another major aspect of the present invention.

It has been discovered that H atoms will react with Parylene monomers to give a radical by combining with and stripping H atoms from Parylene N, releasing $H_2$ as a product. This can happen to Parylene molecules both in the gas phase and at the growing film surface, and the result is a new radical. It has been further discovered that the greater the flux of H atoms, the greater the expected effect on polymerization rate. High concentration of H atoms is therefore beneficial. In this respect, JVD has an immediate advantage; that being that in the JVD pressure range (approximately several torr) extremely high fluxes of H atoms are generated, corresponding to approximately 10% or more dissociation of $H_2$ input gas, using a microwave discharge jet source, as is manufactured by the present assignee. The optimum operating pressure for microwave discharges falls in the JVD pressure range, corresponding to several torr. It would be impossible to achieve such high concentrations of H atoms at the much lower typical pressures of standard Parylene deposition systems. Moreover, the use of atomic Hydrogen (highly reactive Hydrogen atoms), in the JVD process, provides a new process tactic and capabilities that have never been utilized in Parylene deposition and cannot be utilized in the Gorham process, where the pressures are too low and the flow is too slow for efficient H atom production.

Previous investigations into promoting polymerization utilizing H atoms, as disclosed by K. Taylor and I. Malkin [Polymer Letters, V.2, 597–599 (1964)], did not investigate the interaction of N atoms with the Parylene system of interest in the present invention. In addition, while the JVD process and apparatus of the present invention also relies on H atoms to induce polymerization by a radical mechanism, it differs greatly from Taylor's and Malkins' work in that:

1) The present invention utilizes a microwave discharge to generate H atoms in extremely high concentration so that a Parylene monomer will be struck many times in transit to the growing film. Therefore, even if the gas reaction is slow, the flux to the growing film is high, and creation of organic radicals at the surface or in the film is efficient. This process of H atom generation is a much more efficient process than hot filament cracking and favors much higher deposition rates.

2) The present invention utilizes high speed jets to convect radicals and H atoms to the substrate, rather than relying on slow diffusion. This promotes high rate by reducing H atom recombination, and allows direction of the depositing Parylene to a given substrate.

3) The present invention involves mainly a surface/film polymerization and indicates that a gas phase reaction of H with Parylene makes a lesser contribution. In Malkin and Taylor's experiment, polymeric species formed in the gas phase deposited to make the film. The present JVD Parylene apparatus relies on a surface "quasi-liquid" film mechanism.

Figure 5:
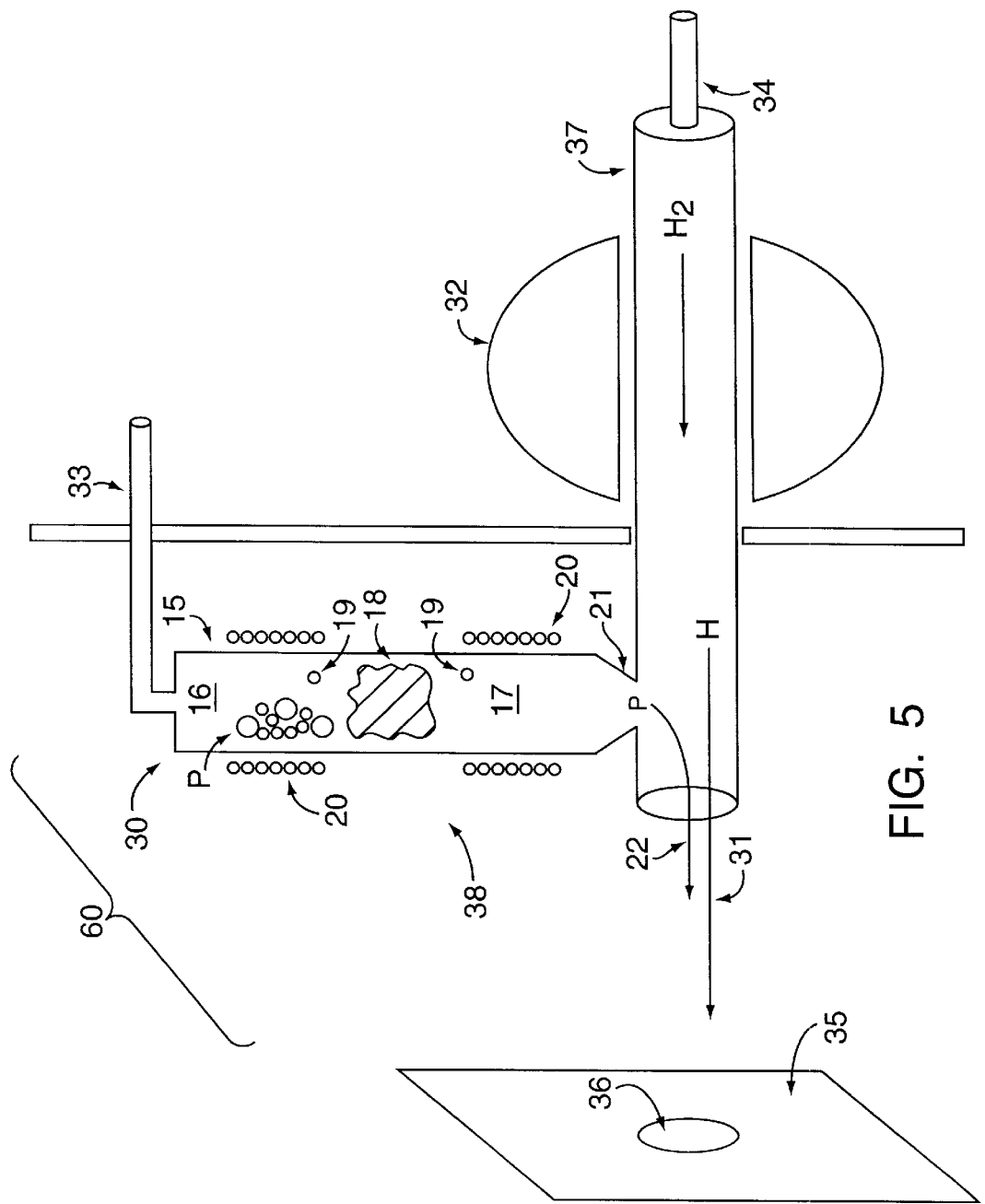
FIG. 5 is a simplified schematic illustration of a preferred embodiment of the H atom assisted Parylene deposition JVD apparatus source.

A preferred embodiment of the H atom assisted JVD Parylene apparatus source 60 is shown in FIG. 5. It can be regarded as a combination of a JVD Parylene apparatus source 40 as illustrated in FIG. 4, with a JVD microwave discharge jet source of H atoms, the two sources being joined at right angles.

The Parylene section 30 is approximately the same as that shown in FIG. 4. The nozzle 15 is a straight tube of quartz or a tube of Pyrex joined to a tube of quartz by a graded seal; the diameter is ½ inch O.D; and the entire length is 3–4 inches. The nozzle 15 contains a low temperature vaporization section 16, which can be crafted from Pyrex, for vaporizing the Parylene dimer precursor, which is placed within the nozzle 15 and is available in powder or granular form P. This is followed by a high temperature cracking section 17, preferably crafted from quartz or the like, to generate the reactive monomer as described previously. In a preferred embodiment, the cracking section 17 is separated from the vaporization section by a quartz wool plug 18, tight enough to stop the Parylene powder from being dragged downstream by the fast gas flow, but loose enough to permit free flow of vaporized Parylene. The junctions of two thermocouples 19, typically 0.005" diameter chromel-alumel, are placed in both the vaporization and cracking sections, 16 and 17 respectively, for temperature measurement. Both sections are wound with electrically heatable coils 20 and maintained at the required temperatures, approximately 150° C. for vaporization and approximately 680° C. for cracking, by means of temperature controllers using the outputs of the thermocouples 19 in a feedback loop (not shown). The jet exit 21 of the cracking section is contracted to a diameter preferably approximately 1–5 millimeters (mm) and more preferably approximately 2 mm, by heating in a torch, so that the nozzle pressure can be kept higher than that downstream, and the flow speed in the nozzle 15 kept lower than downstream.

The vaporization section 16 is loaded with the Parylene granules P and the nozzle 15 is mounted in a deposition chamber 38. The nozzle 15 is supplied with, for example, He or Ar carrier gas at approximately 1 torr, and pumped with a mechanical pump of moderate speed (e.g., 4000 liters/minute), via inlet 33. The vaporization and cracking heating coils 20 are then activated and the parylene dimer is carried from vaporization section 16 to cracking section 17. The result is a collimated inert carrier gas jet 22 that emerges from the cracking section carrying reactive para-xylylene monomers. The jet 22 is traveling at speeds of more than several thousand cm/second.

The microwave discharge jet 31 is produced by a straight quartz tube 37 of ½" diameter, which passes through a ½" Cajon fitting in a 4" vacuum flange. A ½" Evenson microwave heating cavity 32 surrounds the quartz tube 37 external to the deposition chamber 38; the microwave cavity being operated at approximately 75 watts. Hydrogen ($H_2$) gas is supplied to the microwave discharge jet via inlet 34. The length of quartz tube 37 protruding into the deposition chamber 38 beyond the microwave cavity 32 is approximately 2 inches. This length is kept as short as possible to minimize loss of H atoms, that is, Hydrogen ions, via H atom surface catalyzed recombination on the inner nozzle walls downstream of the discharge; for this reason too, quartz is the material of choice, since it catalyzes H atom recombination much less effectively than Pyrex. While a microwave heating element operated at approximately 75 watts has been described, the present invention is not limited in this regard as other heating elements and corresponding energy operating levels may be alternatively substituted without departing from the broader aspects of the present invention. Also, while Hydrogen gas has been described the present invention is not limited in this regard as other elements having chemical qualities similar to that of Hydrogen may be alternatively used without departing from the broader aspects of the present invention.

The output of both jets, 22 and 31, merge to form a single high speed jet, containing H atoms and Parylene monomers, which impinges on substrate 35, suspended within the deposition chamber 38, several inches downstream to produce a parylene film 36. In this configuration, H atoms can interact with Parylene monomers in the gas phase or at the growing film. It should be readily appreciated that substrate 35 can be shifted by an apparatus under the direction of an unillustrated system controller, coordinated with both jet flows, 22 and 31, so as to ensure that the entire surface of the substrate 35 is approximately uniformly covered with the deposited film.

Figure 6:
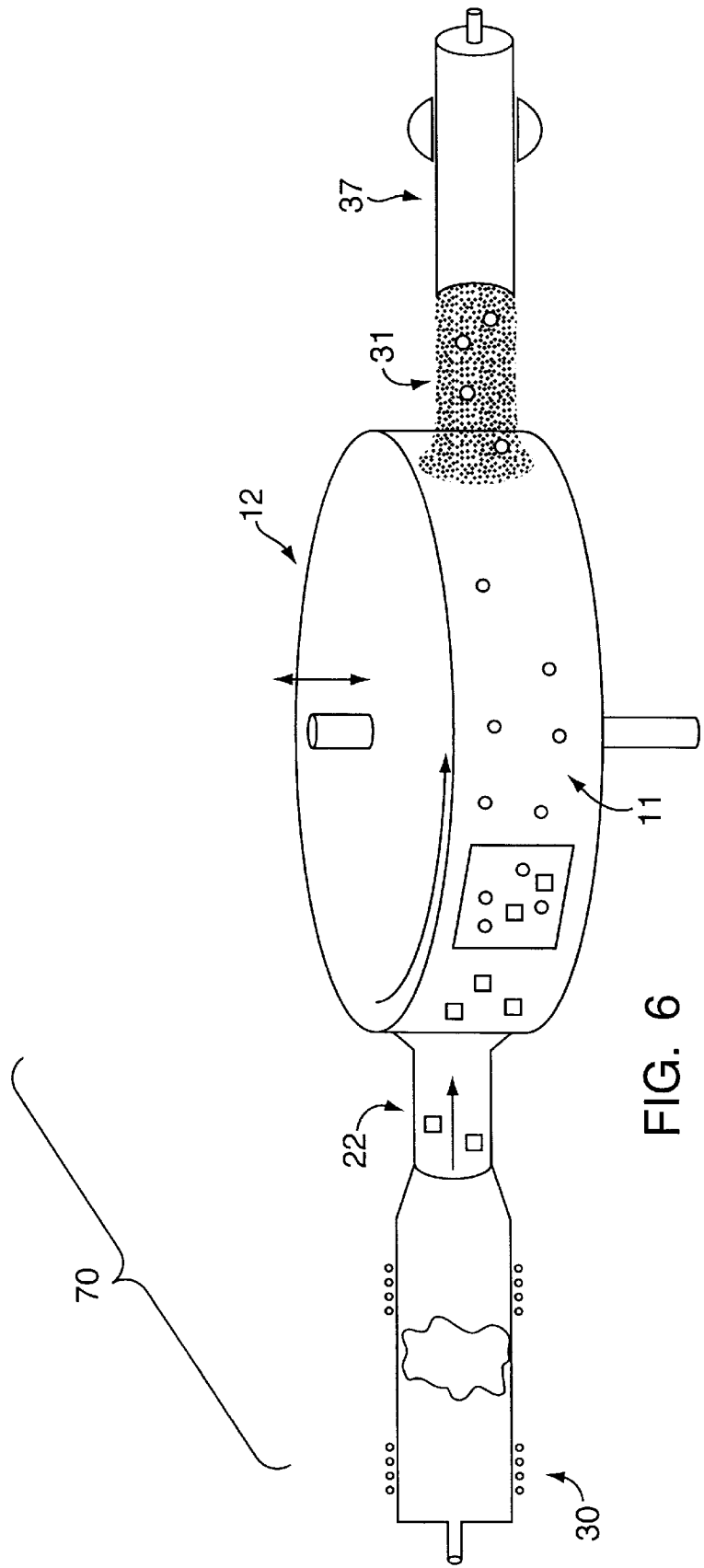
FIG. 6 is a simplified schematic illustration of another preferred embodiment of the H atom assisted Parylene deposition JVD apparatus source.

FIG. 6 illustrates a second embodiment of the present invention 70, having common numerical designations, the Parylene apparatus source 30 and the H atom source 37 are separated, and both are aimed at the moving substrate carousel 12. A substrate 11 will then pass through the Parylene jet 22 and the H atom jet 31 in succession, at an interval determined by the spacing of the jets and the frequency of rotation of the carousel. This is basically a "multiple jet, moving substrate" approach in JVD. In this configuration, H atoms can only interact with Parylene at the growing film surface, and not in the gas phase. While better results are obtained utilizing the combined source than with the separated jet configuration, both provide advantages over the standard Parylene deposition. It should be readily appreciated that substrate carousel 12 can be shifted by a translation apparatus (not shown) under the direction of an unillustrated system controller, coordinated with both jet flows, 22 and 31, so as to ensure that the entire surface of the substrate 11 on substrate carousel 12 is approximately uniformly covered with the deposited film.

When $H_2$ gas is supplied to the nozzle, and the microwave cavity operated at approximately 75 watts, as discussed previously, $H_2$ dissociates to the extent of approximately 10%. This cracking of $H_2$ into H ions provides an extremely high H atom flux. It has been verified that H atoms are present in large concentrations by temporarily inserting a fine (5 mil=0.005") Pt wire which glowed orange-hot due to energy release via surface catalyzed H atom recombination when the concentration of H atoms is close to the 10% range.

It should be noted that in the present deposition chamber, heat from the two sources is transferred by the jet to the carousel, so that the carousel is above room temperature, and warm to the touch at the end of a run. This is significant for the extensive deposition experiments carried out for Parylene N. Parylene N is known not to deposit on substrates even 5° C. above room temperature. It is also worth noting that adhesion is a persistent and serious problem for Parylene N in the standard deposition process.

The apparatus of the present invention, as illustrated in FIGS. 5 and 6, has yielded the following results:

1] Adhesion and Deposition Rate

Deposition rates were followed by measuring thickness per time with a stylus profilometer, or mass deposited, with a Mettler microbalance, while adhesion properties were evaluated utilizing a "Scotch tape" test; a standard, though rough, test for adhesion. The following is results as obtained by the present invention:

H Atoms Off

There was no deposition on the slightly warm substrates, as expected.

H Atoms On

Deposition and growth took place. The films passed a Scotch tape test.

H Atoms On, then Off

Deposition and growth took place when the H atoms were on; no deposition occurred when they were off.

2] Index of Refraction and Dielectric Constant

It has additionally been discovered that it is possible to utilize JVD Parylene as a low k dielectric in microelectronics. Reduced k keeps capacitance low, and preserves fast response (low RC time constant) as dielectric dimensions shrink; the range of interest for future interlayer dielectrics is k=2.0–2.5.

The index of refraction n of "H-atom assisted JVD" Parylene N, according to the apparatus and process of the present invention, on films with thickness of 1800–3000 Å, with H atoms on and off, using an ellipsometer (Rudolph Research AutoEL), was measured. Since Parylene N does not deposit in the absence of H atoms, we used a "cooled carousel" to deposit samples for comparison in the absence of H atoms. The results for the index of refraction n:

H atoms off; n=1.65 (cooled carousel)

H atoms on; n=1.47–1.53 (T>room temperature)

This result is striking. Maxwell's relation between dielectric constant e and refractive index, $k=n^2$, holds approximately for conventional Parylenes, even though the measurement frequencies are quite different; MHz for e and optical frequencies for n. (See Beach et al. Encyclopedia of Polymer Science and Engineering, 1989, page 1006). It is reasonable to expect the Maxwell relation to hold also for Parylene N deposited with H atoms. A dielectric constant of k~2.16–2.34 is therefore obtainable, a significant reduction from the conventional value of k=2.65, and within the range of interest.

The present invention shows that effects of H atoms during deposition on the adhesion, growth and index of refraction of Parylene N are remarkable, and further, show clearly the advantages of the H atom assisted Parylene JVD source. The explanation of these advantages, as discussed above, has three main parts, since the three major effects of H atoms are to:

promote adhesion to the substrate;

accelerate radical polymerization and growth within the film; and improve film properties.

Adhesion is determined largely by how well the first layer of organic molecules chemically binds to the substrate. The effect of H atoms here is to clean off the substrate by removal of oxides and perhaps other adsorbed species. H atoms are high reactive, and even at room temperature are known to reduce oxides of many metals such as Cu, Ni, W, Ti, . . . . etc., to the clean metal. When Parylene is deposited on glass or silicon wafers, which may have a partial or complete oxide layer, H atoms remove this layer and create dangling bonds. These dangling bonds then become adsorption sites where Parylene precursor molecules/radicals can adsorb. The more bonds formed with the substrate in this first layer, the better will be the adhesion.

H atoms promote film growth by creating radicals at the surface of the growing film, for example by hydrogen abstraction of hydrogen atoms bound to the Parylene molecule:

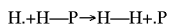

These .P radicals can then have two fates: they can enter the film (which is regarded as quasi-liquid) or they can remain on the surface. If they remain on the surface, they become sites which can react with and bind any incoming Parylene molecule or radical that strikes it. In this case, the deposition rate is increased, since the capture of incoming Parylene is greatly augmented by increasing the number of possible adsorption sites.

If the .P radicals enter the film, they act to promote radical polymerization via the usual mechanism known to occur in Parylene films. One effect of generating large numbers of .P is to promote crosslinking, thus favoring a more rigid film. Such a film would be less polarizable, and have a smaller dielectric constant, which is consistent with the findings of a lower index of refraction after growth in the presence of H atoms.

In effect the H atoms act as initiators, creating .P radicals that can either continue the polymerization, or act as adsorption sites for condensation of further parylene precursors. This differs from radical polymerization in the bulk liquid, where the amount of initiator (such as a di-alkyl peroxide) is small, and required only to initiate the reaction. Here H atom initiators are supplied continuously to "force" the reaction, and at a flux comparable to the deposition rate of the desired polymer product, in this case a Parylene N film.

It is worth noting another advantage of the high speed JVD Parylene approach over the standard, low flow speed approach; that is, the suppression of "snow" formation. In a slow flow, where radicals have long residence times in the gas phase, clustering and particle growth can occur; this leads to hazy films of diminished quality [see W. F. Beach et al, Encyclopedia of Polymer science and Engineering, V 17, 2nd edition, pages 990–1025, John Wiley and Sons, 1989].

One skilled in the art will note that although we have described a JVD invention directed at Parylene, the apparatus and process are adaptable to deposition of other polymer precursors. For example, styrene has a vapor pressure of several torr at room temperature, but, unlike Parylene, needs a chemical or plasma initiator to trigger radical polymerization. It has been discovered that a jet source of styrene molecules will sustain "BET type" multilayers of styrene monomer on the substrate, and a simultaneous flux of H atoms impinging on those multilayers will act as initiators to create styrene radicals and promote polymerization. A similar approach would apply to other known polymer precursors. It will therefore be readily appreciated that other polymer precursors may be alternatively utilized in the JVD apparatus and process without departing from the broader aspects of the present invention.

One skilled in the art will also appreciate that although the description of the H atom assisted Parylene deposition source contains numerous specifications, these should not be construed as limiting the scope of the invention, but merely as providing illustrations of some preferred embodiments of the invention. For example, the Parylene vaporization and cracking sections can have other designs and dimensions, as can the H atom generation nozzle. Other materials of construction can be employed. Although the invention has been shown in a preferred embodiment, it should be understood by those skilled in the art that various changes, omissions and additions may be made without departing from the spirit and scope of the present invention.

This disclosure has described a method and apparatus for hydrogen atom assisted deposition of Parylene on surfaces, using a Jet Vapor Deposition™(JVD™) system with multiple or single jet sources. Several advantages we have demonstrated with this approach are greatly increased deposition rate, increased adhesion, and improved physical properties of the deposited film. A major feature of this invention is a combined H atom in combination with a Parylene jet source of Parylene precursor or separate microwave discharge jet source of H atoms, so as to deposit Parylene in the presence of H atoms that also impinge on the substrate and/or growing film.

While the present invention has been described with reference to the preferred embodiment, it will be understood by those skilled in the art that various obvious changes may be made, and equivalents may be substituted for elements thereof, without departing from the essential scope of the present invention. Therefore, it is intended that the invention not be limited to the particular embodiments disclosed, but that the invention includes all embodiments falling within the scope of the appended claims.

What is claimed is:

1. A method for the vapor deposition of a material film upon a substrate, comprising the steps of:
   operating a pump to set an interior of a deposition chamber, having an access port, at a predetermined pressure;
   positioning a substrate within said deposition chamber interior;
   providing a nozzle with a predetermined quantity of vaporized polymer precursor;
   supplying said nozzle with a pressurized flow of a carrier gas provided at a pressure greater than said predetermined pressure of said deposition chamber, the relation between said carrier gas pressure and said deposition chamber pressure being sufficient to produce a supersonic rate of flow of vaporized polymer gas, comprising said carrier gas and said vaporized polymer precursor, from said nozzle to said deposition chamber; and
   wherein said vaporized polymer precursor gas impinges upon said substrate through said port and forms said material film.

2. The method for vapor deposition of a material film upon a substrate according to claim 1, further comprising the steps of:
   providing said nozzle with a Parylene vaporized polymer precursor.

3. The method for vapor deposition of a material film upon a substrate according to claim 2, further comprising the steps of:
   moving said substrate within said deposition chamber from a first postion to a second position.

4. The method for the vapor deposition of a material film upon a substrate according to claim 1, further comprising the steps of:
   loading said nozzle with a predetermined quantity of unvaporized polymer precursor;
   vaporizing said polymer precursor within said nozzle;
   plugging said nozzle with a plug so that said unvaporized polymer precursor cannot travel to said deposition chamber, while allowing said vaporized polymer precursor gas to travel through said plug to said deposition chamber;
   energizing two sets of heating coils secured about said nozzle so that one set of coils acts to vaporize said unvaporized polymer precursor within said nozzle, while the another set of coils acts to crack said vaporized polymer precursor into reactive monomers, also within said first nozzle; and
   wherein said vaporizing coils are energized to a temperature lower than that of said cracking coils.

5. The method for the vapor deposition of a material film upon a substrate according to claim 4, further comprising the steps of:
   mounting said substrate upon a vertically displaceable rotating carousel whereby said carousel is controlled so as to ensure that said substrate is approximately uniformly covered with said material film.

6. A method for the vapor deposition of a material film upon a substrate, comprising the steps of:
   operating a pump to set an interior of a deposition chamber, having an access port, at a predetermined pressure;
   positioning a substrate within said deposition chamber interior;
   providing a first nozzle with a predetermined quantity of vaporized polymer precursor;
   supplying said first nozzle with a pressurized flow of a carrier gas provided at a pressure greater than said predetermined pressure of said deposition chamber, the relation between said carrier gas pressure and said deposition chamber pressure being sufficient to produce a supersonic rate of flow of vaporized polymer precursor gas, comprising said carrier gas and said vaporized polymer precursor, from said first nozzle to said deposition chamber;
   providing a second nozzle with a pressurized flow of elemental gas provided at a pressure greater than said predetermined pressure of said deposition chamber;
   heating said flow of elemental gas within said second nozzle so as to produce a corresponding flow of atoms, the relation between said atom flow pressure and said deposition chamber pressure being sufficient to produce a flow of said atoms from said second nozzle to said deposition chamber;
   wherein said vaporized polymer precursor gas and said flow of atoms impinge upon said substrate through said port and together form said material film.

7. The method for the vapor deposition of a material film upon a substrate according to claim 6, further comprising the steps of:
   providing said first nozzle with one of a Parylene and Styrene vaporized polymer precursor;
   providing said second nozzle with a pressurized flow of Hydrogen gas; and
   heating said Hydrogen gas so as to produce Hydrogen atoms.

8. The method for the vapor deposition of a material film upon a substrate according to claim 7, further comprising the steps of:

integrally forming said first nozzle and said second nozzle so that said vaporized polymer precursor gas and said flow of atoms enter said deposition chamber through a common port and are mixed thereby before impinging upon said substrate.

9. The method for the vapor deposition of a material film upon a substrate according to claim 8, further comprising the steps of:

moving said substrate within said deposition chamber so as to ensure that said substrate is approximately uniformly covered with said material film.

10. The method for the vapor deposition of a material film upon a substrate according to claim 7, further comprising the steps of:

forming said first nozzle and said second nozzle separately so that said vaporized polymer precursor gas and said flow of atoms independently impinge upon said substrate to form said material film.

11. The method for the vapor deposition of a material film upon a substrate according to claim 10, further comprising the steps of:

mounting said substrate upon a vertically displaceable rotating carousel whereby said carousel is controlled so as to ensure that said substrate is approximately uniformly covered with said material film.

12. The method for the vapor deposition of a material film upon a substrate according to claim 6, further comprising the steps of:

loading said first nozzle with a predetermined quantity of unvaporized polymer precursor;

vaporizing said polymer precursor within said nozzle;

plugging said first nozzle with a plug so that said unvaporized polymer precursor cannot travel to said deposition chamber, while allowing said vaporized polymer precursor gas to travel through said plug to said deposition chamber;

energizing two sets of heating coils secured about said first nozzle so that one set of coils acts to vaporize said unvaporized polymer precursor within said first nozzle, while the another set of coils acts to crack said vaporized polymer precursor into reactive monomers, also within said first nozzle; and wherein said vaporizing coils are energized to a temperature lower than that of said cracking coils.

13. The method for the vapor deposition of a material film upon a substrate according to claim 12, further comprising the steps of:

operating an excitation device to heat said flow of elemental gas within said second nozzle so as to produce said atoms.

14. The method for the vapor deposition of a material film upon a substrate according to claim 6, further comprising the steps of:

merging said vaporized polymer precursor gas and said flow of atoms to form a single high-speed jet.

* * * * *